(12) United States Patent
Fluitt et al.

(10) Patent No.: US 10,573,949 B2
(45) Date of Patent: Feb. 25, 2020

(54) ADDITIVE MANUFACTURED RF MODULE

(71) Applicant: Space Systems/Loral, LLC, Palo Alto, CA (US)

(72) Inventors: Daniel Andrew Fluitt, Santa Rosa, CA (US); Jeanine Olson, San Jose, CA (US); Gregory Pettey, Torrance, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 109 days.

(21) Appl. No.: 15/818,542

(22) Filed: Nov. 20, 2017

(65) Prior Publication Data

US 2019/0036193 A1 Jan. 31, 2019

Related U.S. Application Data

(60) Provisional application No. 62/539,458, filed on Jul. 31, 2017.

(51) Int. Cl.
*H01P 5/02* (2006.01)
*H01P 3/12* (2006.01)
(Continued)

(52) U.S. Cl.
CPC ............... *H01P 5/02* (2013.01); *B33Y 80/00* (2014.12); *H01P 1/022* (2013.01); *H01P 1/042* (2013.01);
(Continued)

(58) Field of Classification Search
CPC combination set(s) only.
See application file for complete search history.

(56) References Cited

U.S. PATENT DOCUMENTS 9,306,254 B1 * 4/2016 Hovey .................... H01P 3/06
2017/0200997 A1 7/2017 Gomberg

FOREIGN PATENT DOCUMENTS

CN 106356640 A 1/2017
WO WO 2017/049367 A1 3/2017
(Continued)

OTHER PUBLICATIONS

Booth, P. et al., "Using additive manufacturing for feed chain and other passive microwave components," Airbus Defence and Space Ltd., 11th European Conference on Antennas and Propagation (EUCAP), 2017, 5 pages.
(Continued)

*Primary Examiner* — Robert J Pascal
*Assistant Examiner* — Kimberly E Glenn
(74) *Attorney, Agent, or Firm* — Weaver Austin Villeneuve & Sampson LLP

(57) ABSTRACT

A spacecraft includes a feed array that includes a plurality of unitary modules, each module including a respective plurality of radio frequency (RF) waveguides structurally coupled together with at least one connecting feature. For each unitary module, the at least one connecting feature and a wall structure defining the respective plurality of waveguides are co-fabricated using an additive manufacturing process. The plurality of unitary modules includes a first unitary module including a first plurality of waveguides and a second unitary module including a second plurality of waveguides. The first unitary module and the second unitary module are configured to be integrated together so as to electrically couple at least one of the first plurality of waveguides with at least one of the second plurality of waveguides.

17 Claims, 5 Drawing Sheets

(51) Int. Cl.
  *H05K 7/20* (2006.01)
  *H01P 1/207* (2006.01)
  *H01P 11/00* (2006.01)
  *H01P 1/04* (2006.01)
  *H01P 1/02* (2006.01)
  *B33Y 80/00* (2015.01)

(52) U.S. Cl.
  CPC ............... *H01P 1/207* (2013.01); *H01P 3/12* (2013.01); *H01P 11/002* (2013.01); *H05K 7/2039* (2013.01)

(56) References Cited

FOREIGN PATENT DOCUMENTS

| WO | WO 2017/079130 A1 | 5/2017 |
| WO | WO 2018/029455 A1 | 2/2018 |

OTHER PUBLICATIONS

Booth, P. et al., "Enhancements to satellite feed chain performance, testing and lead-times using additive manufacturing," Airbus Defence and Space Ltd. 10th European Conference on Antennas and Propagation (EuCAP), Apr. 10-15, 2016, 5 pages.

Peverini, O.A. et al., "Selective laser melting manufacturing of microwave waveguide devices," National Research Council of Italy, Turin, Italy, Proceedings of the IEEE, 2016, 12 pages.

Thornton, J. et al., "Additive Manufacturing of Waveguide for Ku-band Satellite Communications Antenna", European Conference on Antennas and Propagation (EuCAP), Davos, Switzerland, Apr. 10-15, 2016, 4 pages.

Extended European Search Report dated Dec. 19, 2018 issued in EP Application No. 18185270.8.

Dimitriadis et al., "Polymer-Based Additive Manufacturing of High-Performance Waveguide and Antenna Components," Proceedings of the IEEE, vol. 105. No. 4., Apr. 1, 2017, XP055532388, pp. 668-676.

\* cited by examiner

ADDITIVE MANUFACTURED RF MODULE

CROSS-REFERENCE TO RELATED APPLICATIONS

This disclosure claims priority to U.S. Provisional Patent Application No. 62/539,458, filed Jul. 31, 2017, entitled "ADDITIVE MANUFACTURED RF MODULE", assigned to the assignee hereof, the disclosure of which is hereby incorporated by reference in its entirety into this Patent Application for all purposes.

TECHNICAL FIELD

The present disclosure relates generally to radio frequency (RF) components such as RF waveguides and passive RF hardware components, and particularly to an additive manufactured RF module that includes a number of RF components coupled together mechanically with at least one structural feature.

BACKGROUND OF THE INVENTION

The assignee of the present invention manufactures and deploys spacecraft for, inter alia, communications and broadcast services. The spacecraft include antenna systems to transmit and receive RF signals. An antenna system may typically include a reflector illuminated by a feed array of radiating elements, each radiating element coupled with one or more waveguides.

The waveguides are conventionally made of extruded metal making up walls of hollow, tube-like structures, having a rectangular, square or circular cross section, for example. A length of waveguide may include a flange at one or both ends for mating to a second waveguide or other RF component. Interfaces with bracketry or other structural components that secure the waveguides to spacecraft structural features may also be provided.

Improved techniques that reduce the design, fabrication and integration costs of waveguides, while reducing the mass of an arrangement of waveguides, are desirable.

SUMMARY

According to some implementations, a spacecraft includes a feed array that includes a plurality of unitary modules, each module including a respective plurality of radio frequency (RF) waveguides structurally coupled together with at least one connecting feature. For each unitary module, the at least one connecting feature and a wall structure defining the respective plurality of waveguides are co-fabricated using an additive manufacturing process. The first unitary module including a first plurality of waveguides and a second unitary module including a second plurality of waveguides. The first unitary module and the second unitary module are configured to be integrated together so as to electrically couple at least one of the first plurality of waveguides with at least one of the second plurality of waveguides.

In some examples, the wall structure may be a nonmetallic material and the RF waveguides may include a metal plating on interior portions of the wall structure.

In some examples, one or more ends of the RF waveguides may include flanges and the at least one connecting feature, the wall structure and the flanges may be co-fabricated using the additive manufacturing process.

In some examples, the RF waveguides may include or may be coupled with one or both of a passive RF component and a thermal component. In some examples, the passive RF component includes a filter. In some examples, the thermal component includes a radiator.

In some examples, at least one unitary module may include a structural feature for mounting to a structure of the feed array.

According to some implementations, an apparatus includes a feed array including a plurality of unitary modules, each module including a respective plurality of radio frequency (RF) waveguides structurally coupled together with at least one connecting feature. The at least one connecting feature and a wall structure defining the plurality of waveguides are co-fabricated using an additive manufacturing process. The plurality of unitary modules includes a first unitary module including a first plurality of waveguides and a second unitary module including a second plurality of waveguides. The first unitary module and the second unitary module are configured to be integrated together so as to electrically couple at least one of the first plurality of waveguides with at least one of the second plurality of waveguides.

In some examples, the wall structure may be a nonmetallic material and the RF waveguides may include a metal plating on interior portions of the wall structure.

In some examples, one or more ends of the RF waveguides may include flanges that are co-fabricated using the additive manufacturing process.

In some examples, the RF waveguides may include or may be coupled with one or both of a passive RF component and a thermal component. In some examples, the passive RF component may include a filter. In some examples, the thermal component may include a radiator.

In some examples, at least one unitary module may include a structural feature for mounting to a structure of the feed array.

According to some implementations, a method includes fabricating a plurality of unitary modules, each module including a respective plurality of radio frequency (RF) waveguides structurally coupled together with at least one connecting feature, the plurality of modules including a first unitary module including a first plurality of RF waveguides and a second unitary module including a second plurality of RF waveguides and integrating the first unitary module and the second unitary module so as to electrically couple at least one of the first plurality of waveguides with at least one of the second plurality of waveguides. For each unitary module, the at least one connecting feature and a wall structure defining the respective plurality of waveguides are co-fabricated using an additive manufacturing process.

In some examples, the wall structure may be a nonmetallic material and the RF waveguides may include a metal plating on interior portions of the wall structure.

In some examples, one or more ends of the RF waveguides may include flanges and the at least one connecting feature, the wall structure and the flanges may be co-fabricated using the additive manufacturing process.

In some examples, the RF waveguides may include or may be coupled with one or both of a passive RF component and a thermal component. In some examples, the passive RF component may include a filter. In some examples, the thermal component may include a radiator.

BRIEF DESCRIPTION OF THE DRAWINGS

Features of the invention are more fully disclosed in the following detailed description of the preferred embodiments, reference being had to the accompanying drawings, in which.

DETAILED DESCRIPTION

Specific exemplary embodiments of the invention will now be described with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element, or intervening elements may be present. It will be understood that although the terms "first" and "second" are used herein to describe various elements, these elements should not be limited by these terms. These terms are used only to distinguish one element from another element. As used herein, the term "and/or" includes any and all combinations of one or more of the associated listed items. The symbol "/" is also used as a shorthand notation for "and/or".

The terms "spacecraft", "satellite" and "vehicle" may be used interchangeably herein, and generally refer to any orbiting satellite or spacecraft system.

Figure 1:
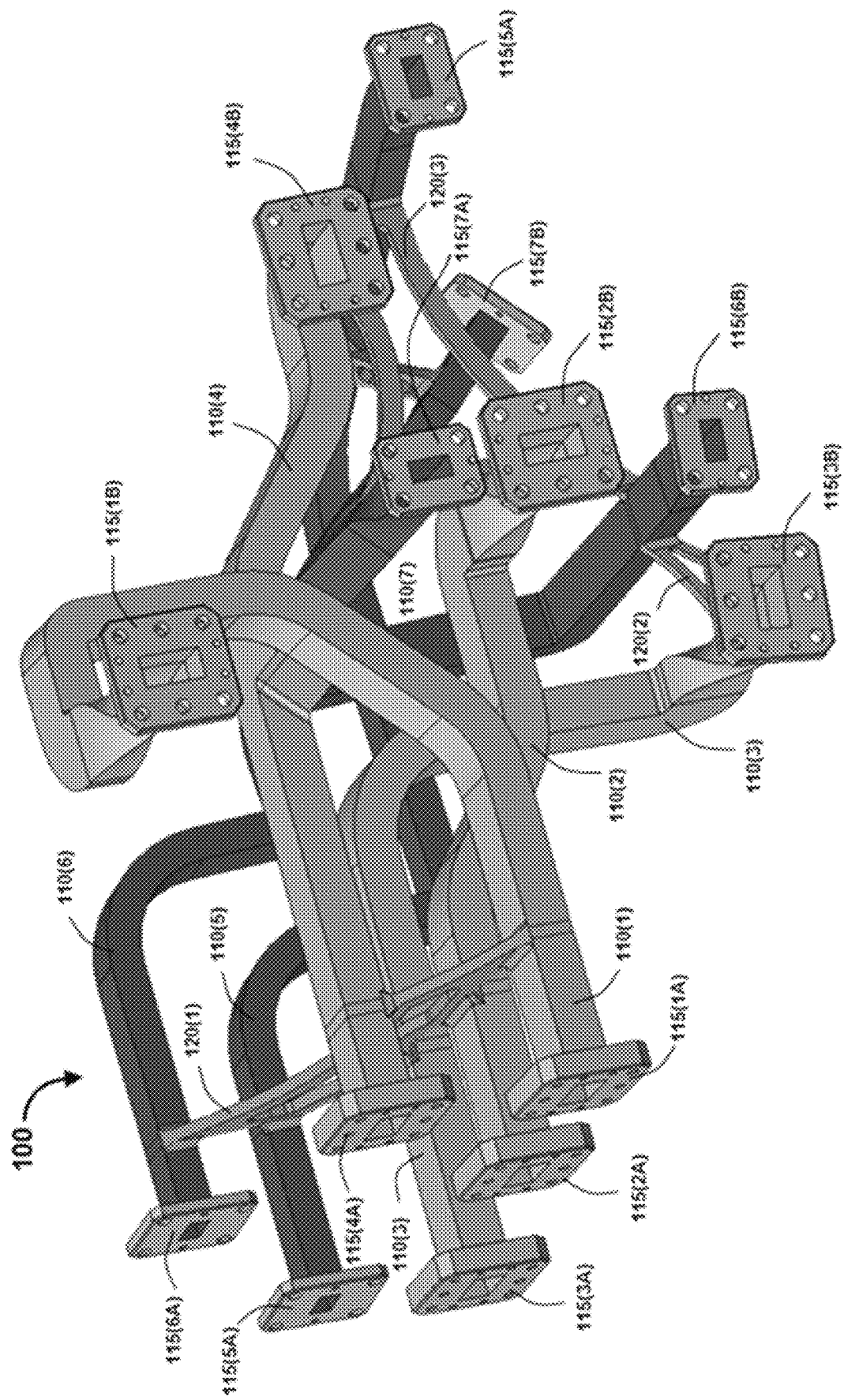
FIG. 1 illustrates an example of a unitary module that includes a plurality of RF waveguides, according to an implementation.

Referring to FIG. 1, an example of a unitary module that includes a plurality of RF waveguides is illustrated. In the illustrated example, the module 100 includes seven RF waveguides, RF waveguides 110(1), 110(2), 110(3), 110(4), 110(5), 110(6) and 110(7), but a greater or lesser number are contemplated by the present disclosure. The module 100 also includes three structural or connecting features, connecting features 120(1), 120(2) and 120(3) that may structurally connect the waveguides 110 together and/or provide a structural interface with another unitary module (not illustrated) or structure (not illustrated). For example, a connecting feature 120(1), 120(2) or 120(3) may provide a mounting interface for integration of the module 100 with a spacecraft structure. Advantageously, the connecting features 120 and wall structures of the RF waveguides 110 may be co-fabricated using an additive manufacturing (3D-printing) process. In some implementations, some or all of flanges 115(1A), 115(1B), 115(2A), 115(2B), 115(3A), 115(3B), 115(4A), 115(4B), 115(5A), 115(5B), 115(6A), 115(6B), 115(7A), 115(7B) may also be co-fabricated using an additive manufacturing process together with the wall structures of the RF waveguides 110 and the structural features 120. Accordingly, it should be appreciated that, although elements 110, 115 and 120 are identified separately to emphasize their respective functionality, elements 110, 115 and/or 120 may be fabricated simultaneously from the same material to form the unitary module 100.

Some or all of module 100, in some implementations, may be fabricated from a non-metallic material, for example a photopolymer resin using an additive manufacturing process such as stereolithography or other 3D-printing process, for example. Surfaces of walls of the waveguides 110 may be plated with one or more electrically conductive layers in order to obtain desired electrical properties. Alternatively, or in addition, an additive manufacturing process using an appropriate metal or other electrically conductive material may be contemplated.

It is contemplated that an arrangement such as module 100 may include any number of additive manufactured RF waveguides, some or all of which may be configured to include multiple twists and bends, and diverse run directions. The RF waveguides may be co-fabricated as a single unit, and include linking structural features that allow the RF waveguides to be integrated into a higher assembly as a module, rather than individually. The module may also contain interface and mounting features to allow for direct integration to a spacecraft structure or payload panels and thermal features to regulate heat dissipation. In some implementations, the RF waveguides may include or be coupled with passive RF components, such as filters and/or thermal components such as radiators, that are also co-fabricated with the RF waveguides.

A benefit of the disclosed techniques is simplification of integration of complex RF waveguide arrangements by reducing total part count. In addition, additive manufacturing to produce the interconnecting waveguide sections allows them to be designed without regard to limitations on bend and twist radii, for example, that would apply to conventional extruded metallic tube waveguides. Thus, the presently disclosed techniques permit simpler routing of RF waveguides whether proximate to a feed array or elsewhere on a spacecraft.

Figure 2:
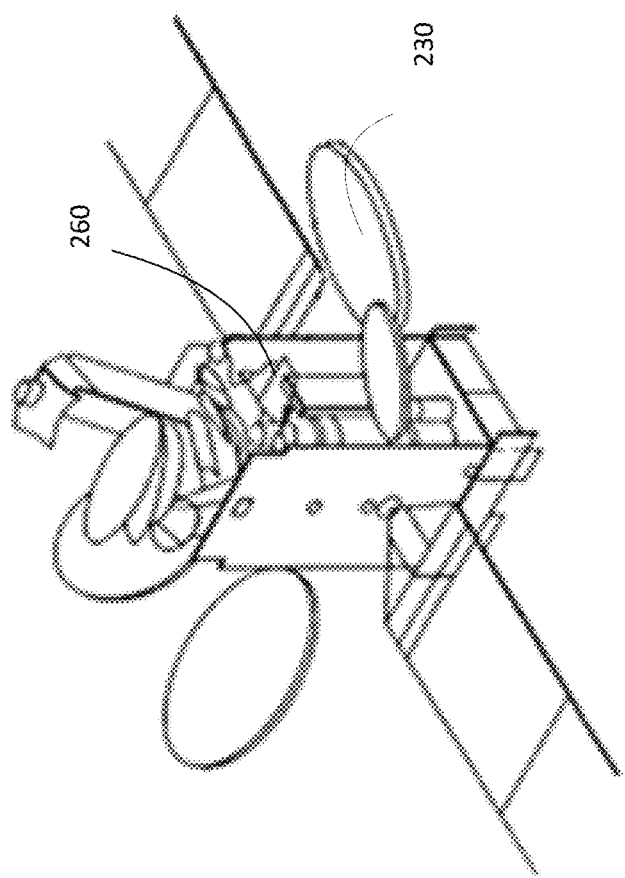
FIG. 2 illustrates an example of a spacecraft 200, according to an implementation.

In some implementations, two or more unitary modules having some or all of the above described features may be integrated together as part of a feed array arrangement of a spacecraft. FIG. 2 illustrates an example of a spacecraft 200, according to an implementation. The spacecraft 200 includes an antenna reflector 230 and a feed arrangement 260. An outboard portion of the feed arrangement 260 may include a number of radiating feed elements (omitted for clarity) configured to illuminate the antenna reflector 230. A waveguide network (omitted for clarity) may be disposed inboard of the radiating feed elements and provide an electrical coupling between the radiating feed elements and spacecraft payload electronics such as transmitters and/or receivers.

Figure 3:
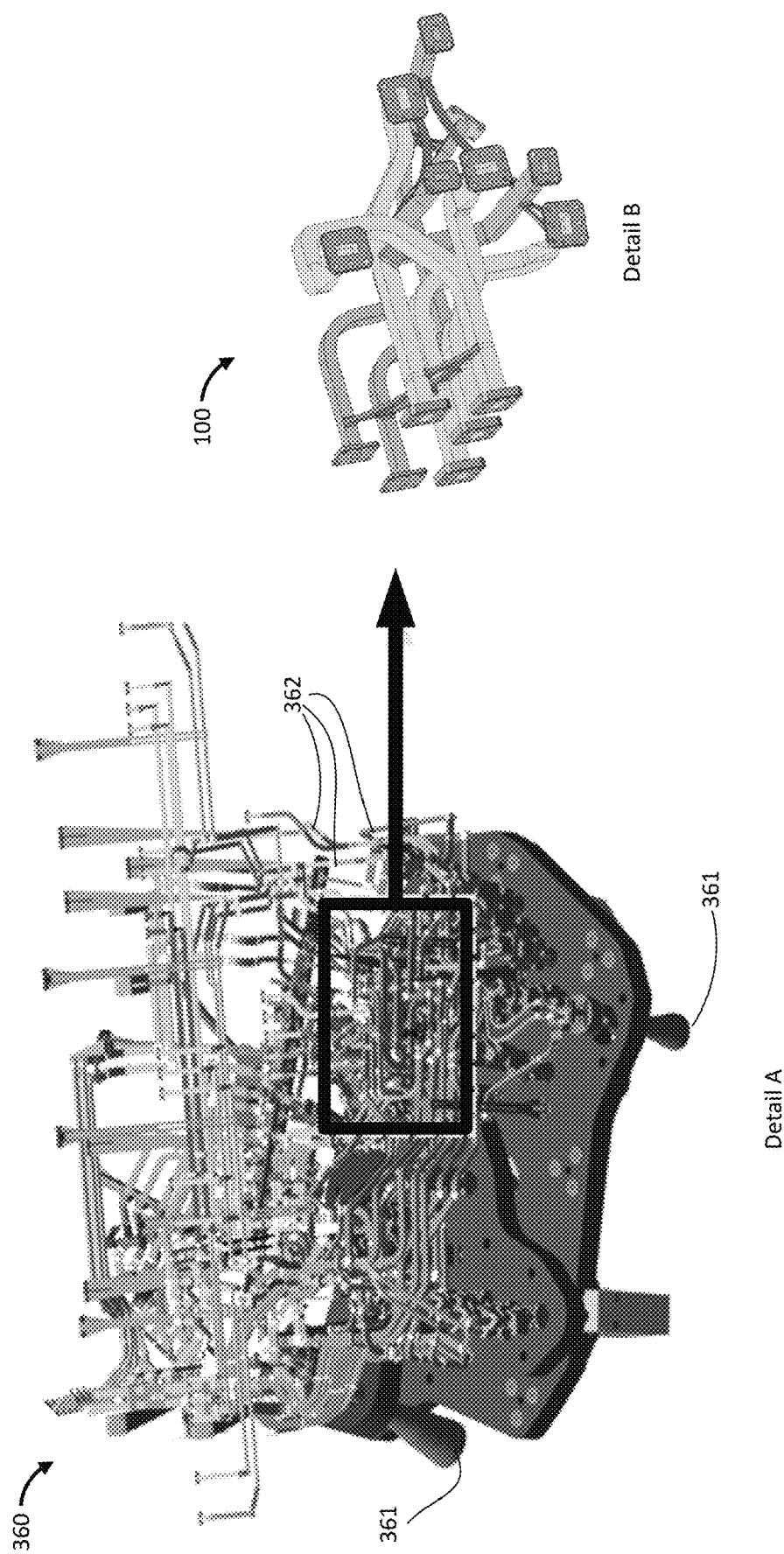
FIG. 3 illustrates features and benefits of the presently disclosed techniques.

Features and benefits of the presently disclosed techniques may be better appreciated by considering FIG. 3. Referring first to Detail A, an example of a spacecraft feed array configured in the absence the presently disclosed techniques is illustrated. The feed array 360 includes a number of radiating feed elements 361 and a number of complexly configured RF waveguides 362, each of which must be individually fabricated and tested and integrated into the feed array 360. Conventionally, each waveguide must be structurally coupled with dedicated bracketry that in turn interfaces with a spacecraft structural feature. It will be appreciated that in designing a feed array such as depicted in Detail A, objectives of minimizing waveguide run length, and feed array volume and mass may be opposed to objectives of ease of assembly and disassembly.

Detail B illustrates that a portion of the feed array 361 may be configured as the unitary module 100. It is contemplated that all or a substantial portion of the waveguides 362 of the feed array 361 may be replaced by a relatively small number of unitary modules of the approximate size and complexity of the illustrated unitary module 100. In the example of FIG. 3, an arrangement of less than twenty unitary modules of the approximate size and complexity of the illustrated unitary module 100 may substitute for the entire set of complexly configured RF waveguides shown in Detail A.

Advantageously, two or more unitary modules may be configured to be integrated together so as to electrically couple one or more waveguides of one of the unitary modules with respective waveguides of another of the unitary modules. The unitary modules may be configured to provide a relatively simple structural interface with adjoining unitary modules and with spacecraft structural features. Advantageously, the unitary module may be structurally self-supporting in, at least, a 1-g laboratory environment, and include integrated bracketry.

Figure 4:
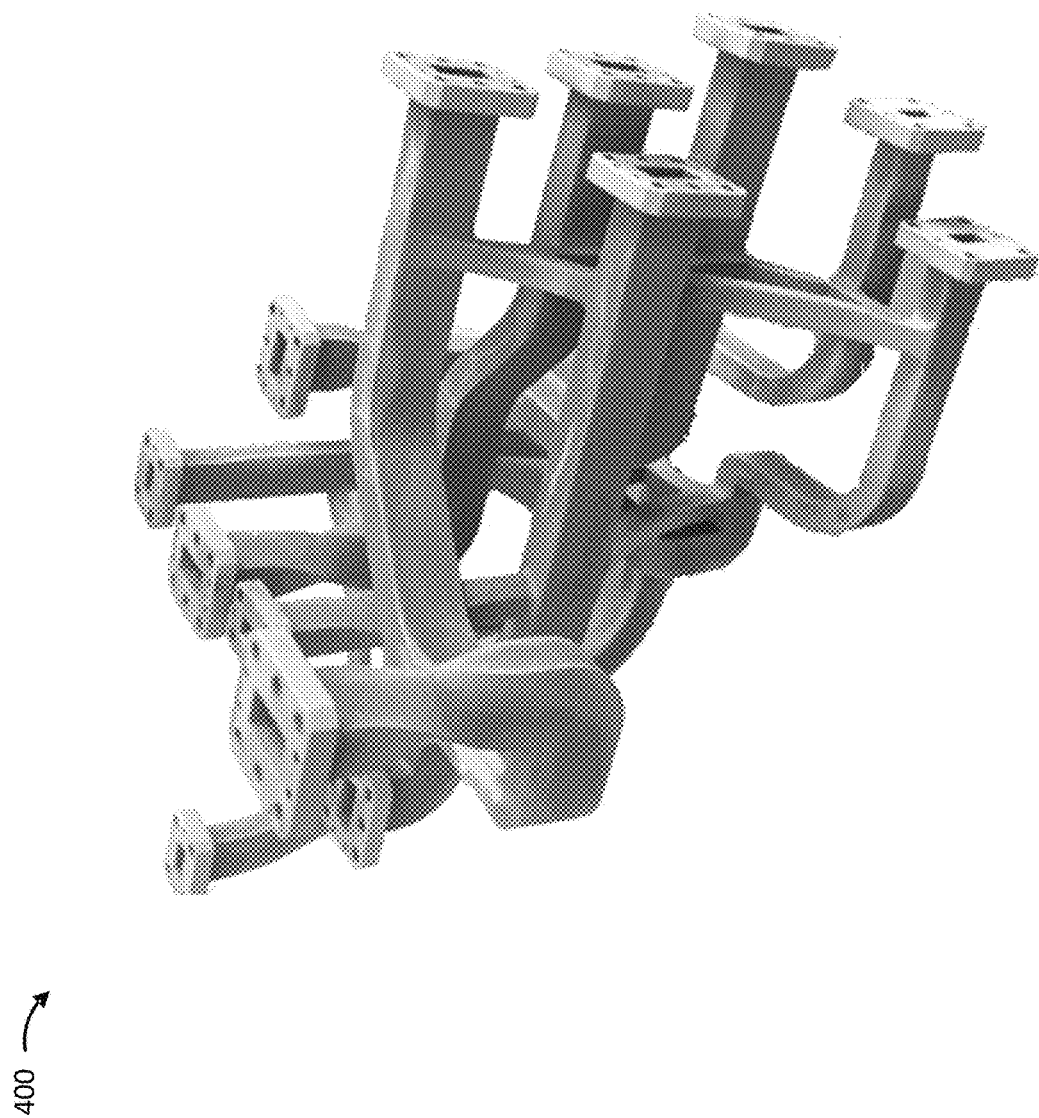
FIG. 4 illustrates a further example of a unitary module configured in accordance with another implementation

FIG. 4 illustrates a further example of a unitary module configured in accordance the presently disclosed techniques. The illustrated unitary module 400 was fabricated using a stereolithographic additive manufacturing process.

Figure 5:
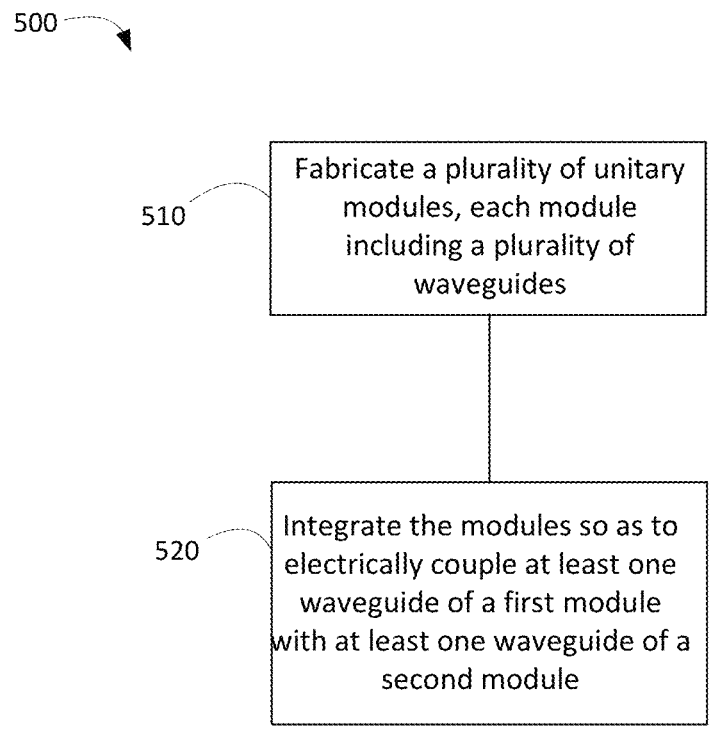
FIG. 5 illustrates a process flow diagram integrating RF modules, according to an implementation Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the subject invention as defined by the appended claims.

FIG. 5 illustrates a process flow diagram integrating RF modules, according to an implementation. A method 500 may start, at block 510, with fabricating a plurality of fabricating a plurality of unitary modules. As described hereinabove, each module may include a respective plurality of radio frequency (RF) waveguides structurally coupled together with at least one connecting feature. The plurality of modules includes at least a first unitary module including a first plurality of RF waveguides and a second unitary module including a second plurality of RF waveguides. Advantageously, for each unitary module, the at least one connecting feature and a wall structure defining the respective plurality of waveguides are co-fabricated using an additive manufacturing process.

At block 520, the first unitary module and the second unitary module may be integrated so as to electrically couple at least one of the first plurality of waveguides with at least one of the second plurality of waveguides.

Thus, an additive manufactured RF module that includes a number of waveguides coupled together mechanically with at least one structural feature has been described. The foregoing merely illustrates principles of the invention. It will thus be appreciated that those skilled in the art will be able to devise numerous systems and methods which, although not explicitly shown or described herein, embody said principles of the invention and are thus within the spirit and scope of the invention as defined by the following claims.

What is claimed is:

1. A spacecraft comprising:
   a feed array, the feed array including a plurality of unitary modules, each module including a respective plurality of radio frequency (RF) waveguides structurally coupled together with at least one connecting feature, wherein:
   for each unitary module, the at least one connecting feature and a wall structure defining the respective plurality of waveguides are co-fabricated using an additive manufacturing process;
   one or more ends of the RF waveguides include flanges; and
   the at least one connecting feature, the wall structure and the flanges are co-fabricated using the additive manufacturing process;
   the plurality of unitary modules includes a first unitary module including a first plurality of waveguides and a second unitary module including a second plurality of waveguides; and
   the first unitary module and the second unitary module are configured to be integrated together so as to electrically couple at least one of the first plurality of waveguides with at least one of the second plurality of waveguides.

2. The spacecraft of claim 1, wherein the wall structure is a nonmetallic material and the RF waveguides include a metal plating on interior portions of the wall structure.

3. The spacecraft of claim 1, wherein the RF waveguides include or are coupled with one or both of a passive RF component and a thermal component.

4. The spacecraft of claim 3, wherein the passive RF component includes a filter.

5. The spacecraft of claim 3, wherein the thermal component includes a radiator.

6. The spacecraft of claim 1, wherein at least one unitary module includes a structural feature for mounting to a structure of the feed array.

7. An apparatus comprising:
   a feed array including a plurality of unitary modules, each module including a respective plurality of radio frequency (RF) waveguides structurally coupled together with at least one connecting feature, wherein:
   the at least one connecting feature and a wall structure defining the plurality of waveguides are co-fabricated using an additive manufacturing process;
   one or more ends of the RF waveguides include flanges that are co-fabricated using the additive manufacturing process;
   the plurality of unitary modules includes a first unitary module including a first plurality of waveguides and a second unitary module including a second plurality of waveguides; and
   the first unitary module and the second unitary module are configured to be integrated together so as to electrically couple at least one of the first plurality of waveguides with at least one of the second plurality of waveguides.

8. The apparatus of claim 7, wherein the wall structure is a nonmetallic material and the RF waveguides include a metal plating on interior portions of the wall structure.

9. The apparatus of claim 7, wherein the RF waveguides include or are coupled with one or both of a passive RF component and a thermal component.

10. The apparatus of claim 9, wherein the passive RF component includes a filter.

11. The apparatus of claim 9, wherein the thermal component includes a radiator.

12. The apparatus of claim 7, wherein at least one unitary module includes a structural feature for mounting to a structure of the feed array.

13. A method comprising:
   fabricating a plurality of unitary modules, each module including a respective plurality of radio frequency (RF) waveguides structurally coupled together with at least one connecting feature, the plurality of modules including a first unitary module including a first plurality of RF waveguides and a second unitary module including a second plurality of RF waveguides; and integrating the first unitary module and the second unitary module so as to electrically couple at least one of the first plurality of waveguides with at least one of the second plurality of waveguides; wherein:

for each unitary module, the at least one connecting feature and a wall structure defining the respective plurality of waveguides are co-fabricated using an additive manufacturing process;

one or more ends of the RF waveguides include flanges; and the at least one connecting feature, the wall structure and the flanges are co-fabricated using the additive manufacturing process.

14. The method of claim 13, wherein the wall structure is a nonmetallic material and the RF waveguides include a metal plating on interior portions of the wall structure.

15. The method of claim 13, wherein the RF waveguides include or are coupled with one or both of a passive RF component and a thermal component.

16. The method of claim 15, wherein the passive RF component includes a filter.

17. The method of claim 15, wherein the thermal component includes a radiator.

* * * * *